(12) United States Patent
Yoshida (10) Patent No.: US 9,516,764 B2
(45) Date of Patent: Dec. 6, 2016

(54) METHOD FOR MANUFACTURING MULTILAYER WIRING SUBSTRATE

(71) Applicant: HITACHI CHEMICAL COMPANY, LTD., Tokyo (JP)

(72) Inventor: Nobuyuki Yoshida, Tokyo (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/778,677

(22) PCT Filed: Mar. 25, 2014

(86) PCT No.: PCT/JP2014/058291
§ 371 (c)(1),
(2) Date: Sep. 21, 2015

(87) PCT Pub. No.: WO2014/157206
PCT Pub. Date: Oct. 2, 2014

(65) Prior Publication Data
US 2016/0050769 A1    Feb. 18, 2016

(30) Foreign Application Priority Data

Mar. 28, 2013  (JP) ................ 2013-069058

(51) Int. Cl.
*H01B 13/00* (2006.01)
*H05K 3/42* (2006.01)
(Continued)

(52) U.S. Cl.
CPC ........... *H05K 3/421* (2013.01); *C23C 18/1653* (2013.01); *C25D 3/38* (2013.01);
(Continued)

(58) Field of Classification Search
CPC ...... H05K 3/421; H05K 3/422; H05K 3/423; H05K 3/425; C25D 3/38; C25D 7/123; C23C 18/1651; C23C 18/165; C23C 18/1653; C23C 18/1834
USPC .......... 438/618, 622, 643, 745, 750; 216/13, 216/17, 18, 19, 39
See application file for complete search history.

(56) References Cited

U.S. PATENT DOCUMENTS 8,878,364 B2 * 11/2014 Morita .............. H01L 23/53238
257/751
2004/0078970 A1 * 4/2004 Naitoh ................... H05K 3/423
29/852

(Continued)

FOREIGN PATENT DOCUMENTS

JP   H11-298141 A   10/1999
JP   2000-269644 A   9/2000

(Continued)

OTHER PUBLICATIONS

International Search Report mailed May 13, 2014, for PCT/JP2014/058291 (1pg).

*Primary Examiner* — Lan Vinh
(74) *Attorney, Agent, or Firm* — Fitch, Even, Tabin & Flannery, LLP (57) ABSTRACT

To provide a method for manufacturing a multilayer wiring substrate, in which an insulating layer and a metal foil provided thereon are integrally laminated on an inner layer material having a wiring formed thereon, in which a hole for via hole is formed in the metal foil and the insulating layer, and in which the hole for via hole is filled with an electrolytic filled plating layer after a base electroless plating layer is formed, the method being featured in that, after the base electroless plating layer is formed, first, an electrolysis filled plating layer is formed to the extent that the hole for via hole is not completely filled, and then, after the surface of the electrolytic filled plating layer is etched, the hole for via hole is completely filled by an electrolytic filled plating layer.

18 Claims, 3 Drawing Sheets

(51) Int. Cl.
*C25D 7/00* (2006.01)
*C25D 5/02* (2006.01)
*C25D 5/10* (2006.01)
*C25D 5/48* (2006.01)
*C23C 18/16* (2006.01)
*H05K 3/06* (2006.01)
*C25D 3/38* (2006.01)
*C25D 5/34* (2006.01)
*C25D 7/12* (2006.01)
*H05K 1/02* (2006.01)
*H05K 1/03* (2006.01)
*H05K 1/09* (2006.01)
*H05K 1/11* (2006.01)
*H05K 3/46* (2006.01)
*C23C 18/40* (2006.01)
*H05K 3/38* (2006.01)

(52) U.S. Cl.
CPC ............... *C25D 5/02* (2013.01); *C25D 5/10* (2013.01); *C25D 5/34* (2013.01); *C25D 5/48* (2013.01); *C25D 7/00* (2013.01); *C25D 7/123* (2013.01); *H05K 1/0298* (2013.01); *H05K 1/0346* (2013.01); *H05K 1/09* (2013.01); *H05K 1/115* (2013.01); *H05K 3/06* (2013.01); *H05K 3/427* (2013.01); *C23C 18/405* (2013.01); *H05K 3/382* (2013.01); *H05K 3/4652* (2013.01); *H05K 3/4661* (2013.01); *H05K 2201/0154* (2013.01); *H05K 2201/0355* (2013.01); *H05K 2201/09545* (2013.01); *H05K 2201/09563* (2013.01); *H05K 2203/0353* (2013.01); *H05K 2203/1423* (2013.01)

(56) References Cited

U.S. PATENT DOCUMENTS

2009/0064493 A1* 3/2009 Kariya ............ H01L 23/49822
 29/829
2010/0081272 A1* 4/2010 Jang ................ H01L 21/76804
 438/637

FOREIGN PATENT DOCUMENTS

| JP | 2003-318544 A | 11/2003 |
| JP | 2008-021770 A | 1/2008 |
| JP | 2009-021581 A | 1/2009 |

\* cited by examiner

METHOD FOR MANUFACTURING MULTILAYER WIRING SUBSTRATE

TECHNICAL FIELD

The present invention relates to a method for manufacturing a multilayer wiring substrate, and more particularly to a method in which a multilayer wiring substrate is manufactured by forming an electrolytic plating layer by using an electrolytic filled plating solution.

BACKGROUND ART

Conventionally, there is proposed a resin film having a copper foil on one face thereof (one-face-copper-foil-attached resin film) configured by providing a copper foil and a prepreg or a copper foil and a resin film as a material used for manufacturing a multilayer wiring substrate by integrally laminating the film on an inner material layer having a wiring formed thereon. Since the copper foil of the one-face-copper-foil-attached resin film is thin, fine wirings can be formed, and hence a high density, thin and miniaturized wirings can be formed. On the other hand, as a via hole connecting wirings of upper and lower layers, a via hole having a minute diameter can be easily formed with increased introduction of a excimer laser and a laser processing machine using third and fourth harmonics of YAG, and with development of a direct laser method using a $CO_2$ laser.

Also, by applying these, a method for manufacturing a multilayer wiring substrate has been actively used, the multilayer wiring substrate being manufactured in such a manner that a prepreg and a metal foil provided on the prepreg are laminated integrally on an inner layer material on which a wiring is formed, and that a hole for via hole is provided by a laser and is filled with an electrolytic plating layer formed by using an electrolytic filled plating solution (hereinafter simply referred to as "electrolytic filled plating layer") after formation of a base electroless plating layer. In this case, in order to suppress plating voids (hereinafter simply referred to as "voids") formed in the via and each having a via diameter which is almost equal to the thickness of the insulating layer, that is, has an aspect ratio of about 1, an electrolytic plating method in which electrolytic plating is performed at a low current density for a long time, or an electrolytic plating method in which current density is controlled stepwise are proposed (Patent Literature 1). Further, as a method for filling a via hole, there is proposed a method in which an electrolytic plating layer is separately formed twice from a viewpoint of surface smoothness (Patent Literature 2).

CITATION LIST

Patent Literature

Patent Literature 1: Japanese Patent Application Laid-Open No. 2003-318544
Patent Literature 2: Japanese Patent Application Laid-Open No. 2009-21581

SUMMARY OF INVENTION

Technical Problem

A problem to be solved is that, when a prepreg and a metal foil provided on the prepreg are laminated integrally on an inner layer material on which a wiring is formed, and then a hole for via hole is provided in the insulating layer formed by the metal foil and the prepreg, and when, after a base electroless plating layer is formed, an upper layer wiring is formed and the hole for via hole is filled with an electrolytic plating layer formed by using an electrolytic filled plating solution, the opening section of the hole for via holes is small and thereby voids are formed in the via hole. It is considered that the voids formed in the via hole causes a trouble when the multilayer wiring substrate is used for a long time or under severe conditions.

In the method disclosed in Patent Literature 1, a method of suppressing the occurrence of voids by controlling the current density is disclosed as a method for manufacturing a multilayer wiring substrate having a multilayer constitution in which an insulating layer made of an organic insulating material, such as polyimide resin, and a wiring made of a conductor material, such as copper, are alternately laminated. However, as a result of studies of the present inventors, the voids could not be completely eliminated by this method. Further, in the method disclosed in Patent Literature 2, the dent generation rate is reduced, but the effect of suppressing the occurrence of voids could not be obtained.

An object of the present invention is to provide a method for manufacturing a multilayer wiring substrate, the method capable of suppressing plating voids of an electrolytic filled plating layer even in a hole for via hole having a via diameter almost equal to the thickness of an insulating layer.

Solution to Problem

The present invention relates to the followings.
1. The present invention provides a method for manufacturing a multilayer wiring substrate, the method including: step (1) of integrally laminating an inner layer material having an inner layer wiring formed thereon, an insulating layer, and a metal foil for upper layer wiring, and of providing, in the metal foil for upper layer wiring and the insulating layer, a hole for via hole extending from the metal foil for upper layer wiring to reach the inner layer wiring; step (2) of forming a base electroless plating layer in the hole for via hole and on the metal foil for upper layer wiring, and then filling the hole for via hole by forming an electrolytic filled plating layer, and forming a via hole connecting the metal foil for upper layer wiring and the inner layer wiring; and step (3) of forming an upper layer wiring by forming, after forming the electrolytic filled plating layer, the metal foil for upper layer wiring into a wiring, wherein, in step (2), filling of the hole for via hole is separately performed twice or more by forming the electrolytic filled plating layer, and the electrolytic filled plating layer, formed in the hole for via hole and on the metal foil for upper layer wiring just before second or subsequent formations of respective electrolytic filled plating layers, is etched.
2. The method for manufacturing the multilayer wiring substrate of item 1 in which step (2) includes: step (2-1) of forming a base electroless plating layer in the hole for via hole and on the metal foil for upper layer wiring; step (2-2) of forming a first electrolytic filled plating layer incompletely filling the hole for via hole; step (2-3) of etching the surface of the first electrolytic filled plating layer formed in step (2-2); and step (2-4) of forming the second electrolytic filled plating layer completely filling the hole for via hole, on the first electrolytic filled plating layer, the surface thereof being etched in step (2-3).

3. The method for manufacturing the multilayer wiring substrate further includes a step of etching the surface of the electrolytic filled plating layer formed just before second or subsequent formations of respective electrolytic filled plating layers in item 1, or a step of etching, in step (2-3) of item 2, wherein the electrolytic filled plating layer previously formed on the metal foil for upper layer wiring is etched until the thickness of the electrolytic filled plating layer becomes at least half or less than the thickness thereof.

Advantageous Effects of Invention

According to the present invention, it is possible to provide a method for manufacturing a multilayer wiring substrate, in which occurrence of plating voids of an electrolytic filled plating layer can be suppressed even in a hole for via hole which has a diameter almost equal to the thickness of an insulating layer.

DESCRIPTION OF EMBODIMENTS

An inner layer material described in the present invention is generally used as an inner layer of a multilayer wiring substrate, and is generally formed in such a manner that a metal foil, which is made of a one-component foil, an alloy foil, or a composite foil respectively containing one or more kinds of components, such as copper, aluminum, brass, nickel, and iron, is laminated integrally on the upper and/or lower surfaces of a required number of resin-impregnated base materials formed by impregnating a reinforcement base material with a resin composition, and the metal foil is formed into a wiring pattern by etching, or the like.

A prepreg described in the present invention serves as an insulating layer connecting an inner layer material and a copper foil for upper layer wiring, and means a resin film which is formed by impregnate such as a glass fiber, serving as a reinforcement base material, with a resin composition (resin varnish), so as to be in a semi-cured B-stage state and has an adhesive property. As the prepreg, a prepreg used in a general multilayer wiring substrate can be used. Further, other than the prepreg, a resin film having no reinforcement base material such as glass fiber, can also be used. Examples of resin films, having no reinforcement base material such as glass fiber, include a polymer epoxy resin, a thermoplastic polyimide adhesive film, or the like, each of which is used for connecting an inner layer material and a copper foil for upper layer wiring in a multilayer wiring substrate.

As the above-described resin composition, it is possible to use a publicly known resin composition used as an insulating material of a multilayer wiring substrate. Usually, a thermosetting resin having good heat resistance and chemical resistance is used as a resin composition, and is used by being combined with one or two or more kinds of resins, such as a phenol resin, an epoxy resin, a polyimide resin, an unsaturated polyester resin, a polyphenylene oxide resin, and a fluororesin. The thermosetting resin is added, as required, with an inorganic powder filler, such as talc, clay, silica, alumina, calcium carbonate, aluminium hydroxide, antimonous oxide, and antimony pentoxide, and a fibrous filler, such as a glass fiber, an asbestos fiber, a pulp fiber, a synthetic fiber, and a ceramic fiber.

Further, in view of dielectric characteristics, shock resistance, film processability, and the like, a thermoplastic resin may be blended in the resin composition. Further, as required, various additives and fillers, such as an organic solvent, a fire retardant, a hardener, a hardening accelerator, a thermoplastic particle, a coloring agent, an ultraviolet impermeable agent, an antioxidant, a reducing agent, and the like, are added and prepared.

As the above-described reinforcement base material, it is also possible to use an inorganic fiber, such as glass and asbestos, and an organic fiber, such as polyester, polyimide, polyacrylic, polyvinyl alcohol, polyimide, and a fluororesin, and a natural fiber woven fabric, such as cotton, and a nonwoven fabric, paper, mat, and the like.

Usually, the reinforcement base material is impregnated or coated with a resin composition so that the amount of the resin composition added to the reinforcement base material becomes 20 to 90% by weight of the resin content of the dried prepreg, and then is usually dried by heating at a temperature of 100 to 200° C. for 1 to 30 minutes, so that a prepreg in a semi-cured state (B-stage state) is obtained. A structure formed by superposing one to twenty sheets of the prepregs, and the structure provided a metal foil on both surfaces thereof is heated and pressed. As forming conditions in this case, forming conditions of a usual method for forming a laminated board can be use. For example, the structure is formed by using a multi-stage press, a multi-stage vacuum press, a continuous molding machine, an autoclave molding machine, and the like, and usually under conditions of a temperature of 100 to 250° C., a pressure of 2 to 100 kg/cm$^2$, and a heating time of 0.1 to 5 hours, or is formed by using a vacuum laminating device, or the like, under lamination conditions of 50 to 150° C. and 0.1 to 5 MPa, and in a pressure-reduced condition or a condition of atmospheric pressure. The thickness of the prepreg used as an insulating layer is changed depending on the use, but the thickness of 0.1 to 5.0 mm is usually preferred.

As the metal foil described in the present invention, a metal foil generally used in a multilayer wiring substrate can be used. As the surface roughness of the metal foil used in the present invention, it is preferred, in view of electrical characteristics, that the 10-point average roughness Rz (JIS B0601) of both surfaces of the metal foil is 2.0 μm or less. As the metal foil, it is possible to use a copper foil, a nickel foil, an aluminum foil, and the like, but a copper foil is usually used. As conditions when a copper foil is formed by using a copper sulfate bath, conditions of sulfuric acid of 50 to 100 g/L, copper of 30 to 100 g/L, a solution temperature of 20 to 80° C., and a current density of 0.5 to 100 A/dm$^2$ are generally used. As conditions when a copper foil is formed by using a copper pyrophosphate bath, conditions of potassium pyrophosphate of 100 to 700 g/L, copper of 10 to 50 g/L, a solution temperature of 30 to 60° C., a pH of 8 to 12, and a current density of 1 to 10 A/dm$^2$ are generally used. In addition, in view of physical properties and smoothness of copper, various additives are added in some cases.

Anti-rust treatment can be performed on the resin adhesion surface of the metal foil by using one of nickel, tin, zinc, chromium, molybdenum and cobalt, or by an alloy of some of nickel, tin, zinc, chromium, molybdenum and cobalt. In this treatment, a thin film is formed on the metal foil by sputtering, electroplating, or electroless plating, and in view of cost, it is preferred to use electroplating. The amount of metal used in the anti-rust treatment varies depending on the kind of the metal, but it is preferred that the total amount of the metal is 10 to 2,000 $\mu g/dm^2$. When the thickness of the layer formed by the anti-rust treatment is too large, the inhibition of etching and the degradation of electrical characteristics are caused. When the thickness of the layer formed by the anti-rust treatment is too small, the peel strength between the resin and the metal foil can be reduced due to the small thickness. Further, when a chromate treatment layer is formed on the layer formed by the anti-rust treatment, the reduction of the peel strength between the resin and the metal foil is suppressed, and hence the chromate treatment is useful.

The via hole described in the present invention is a non-penetrating interlayer connection hole in which a plating layer for connecting layers of two or more wirings is formed, and examples of the via holes include an interstitial via hole (IVH). The hole for via hole means a non-penetrating hole which is used for forming a via hole and which is in a state before a plating layer is formed. Further, examples of the via holes include a hole in which a plating layer is formed on the surface in a hole for via hole, and a filled via in which the inside portion of a hole for via hole is completely filled with a plating layer. A filled via, whose via hole has a diameter almost equal to or twice the thickness of the insulating layer, is easily formed. However, as the diameter becomes more equal to the thickness of the insulating layer, voids are more likely to occur in the conventional method.

The base electroless plating layer described in the present invention is an electroless plating layer provided on the entire surface of a substrate having a hole for via holes formed thereon, and is provided on the surface of a metal foil for upper layer wiring, the side surface in a hole for via holes, the surface of an inner layer wiring on the bottom surface in the hole for via holes, and the like.

The electrolytic filled plating layer described in the present invention means an electrolytic plating layer formed with an electrolytic filled plating solution. The thickness of the electrolytic filled plating layer is set such that the thickness of the electrolytic filled plating layer on the bottom surface in the hole for via holes is larger than the thickness of the electrolytic filled plating layer on the metal foil for upper layer wiring. As the thickness of a first electrolytic filled plating layer, the thickness of the electrolytic filled plating layer on the metal foil for upper layer wiring is preferably in the range of 1 to 10 $\mu m$ and more preferably in the range of 2 to 5 $\mu m$, and the thickness of the electrolytic filled plating layer on the inner layer wiring on the bottom surface of the hole for via holes is set in the range of 2 to 20 $\mu m$. Further, as the thickness of a second electrolytic filled plating layer, the thickness of the electrolytic filled plating layer on the metal foil for upper layer wiring may be set such that the electrolytic filled plating layer can be used as a wiring, and also the hole for via holes can be completely filled with the electrolytic filled plating layer. The thickness of the electrolytic filled plating layer on the metal foil for upper layer wiring is preferably in the range of 1 to 100 $\mu m$ and more preferably in the range of 10 to 50 $\mu m$.

In the electrolytic filled plating solution, an inhibitor for inhibiting the growth of plating, and an accelerator for accelerating the growth of plating are generally added in a copper sulfate plating bath.

With the plating inhibitor, according to the diffusion law of material, material is difficult to be absorbed into the inner portion of the hole for via holes and is easily absorbed into the substrate surface. By applying this, the plating growth rate on the substrate surface is made lower than that in the inner portion of the hole for via holes, so that the inner portion of the hole for via holes is filled with the copper plating layers. Therefore, it is said that there is an effect that a smooth electrolytic filled plating layer is formed on the substrate surface of the portion just above the hole for via holes, and on the substrate surface of the portion except the portion just above the hole for via holes. As the plating inhibitor, it is possible to use a polyether compound, such as polyalkylene glycol, and a nitrogen-containing compound, such as a polyvinyl imidazolium quaternized product, and a copolymer of a vinyl pyrrolidone and a vinylimidazolium quaternized product.

With the plating accelerator, material is uniformly absorbed into the bottom and side surfaces of the hole for via holes, and the substrate face, and then, according to the growth of plating, the surface area is reduced in the inner portion of the hole for via hole, so that the distribution of the accelerator in the hole for via holes becomes dense. By applying this, the plating rate in the inner portion of the hole for via holes is made higher than the plating rate on the substrate surface, so that the inner portion of the hole for via holes is filled with the copper plating layers. Therefore, it is said that there is an effect that a smooth electrolytic filled plating layer is formed on the substrate surface of the portion just above the hole for via holes, and the substrate surface of the portion except the portion just above the hole for via holes. As the plating accelerator, it is possible to use a sulfur compound represented by 3-mercapto-1-propane sulfonic acid sodium or 2-mercapto ethane sodium sulfonate, or a sulfur compound represented by his (3-sulfopropyl)-disulfide disodium, or the like. These plating accelerators are also kinds of additives added to a copper plating solution referred to as brightener (brightening agent).

As the plating inhibitor and the plating accelerator described above, one or two or more of the solutions are mixed and used. The concentrations of the solutions are not limited in particular, but solutions of several mass ppm to several mass percent are used.

In the following, a method for manufacturing a multilayer wiring substrate according to an embodiment of the present invention will be described with reference to FIG. 1 to FIG. 3.

Figure 1:
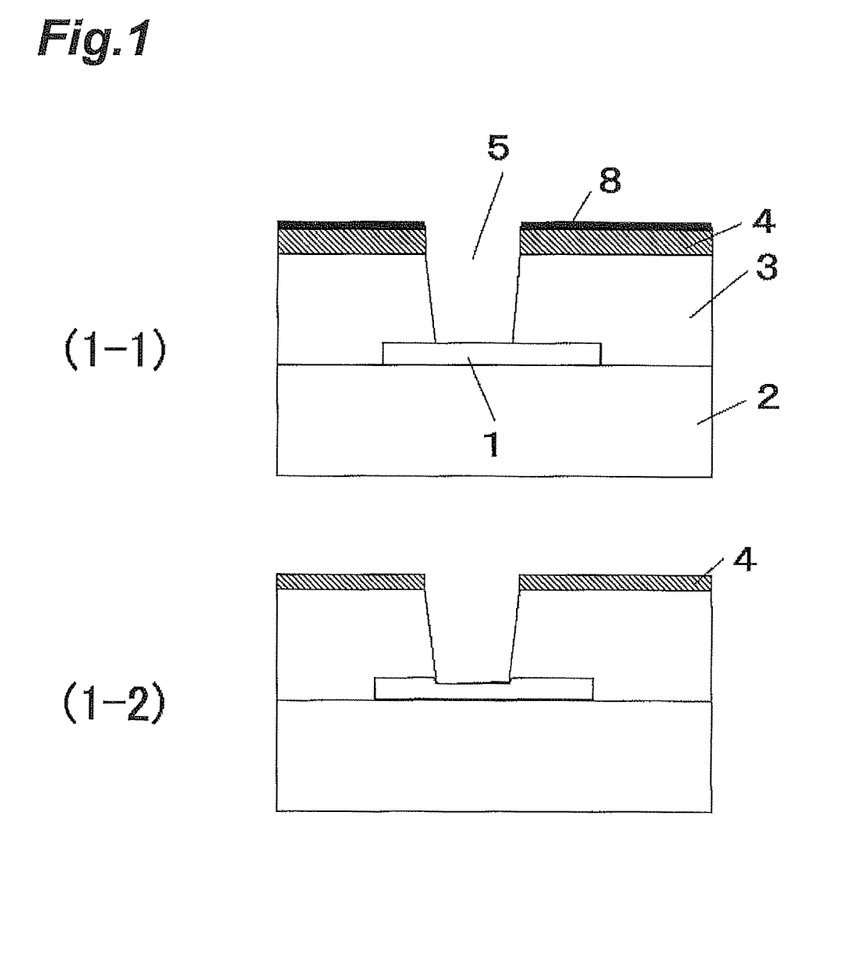
FIG. 1 shows step (1) of a method for manufacturing a multilayer wiring substrate according to an embodiment of the present invention.

First, as shown in step (1-1) of FIG. 1, a prepreg 3 and a copper foil 4 for upper layer wiring on the upper layer thereof are laminated integrally on an inner layer material 2 on which an inner layer wiring 1 is formed. A blackening treatment layer 8 is provided on the copper foil 4 for upper layer wiring, and then a hole 5 for via holes is formed by a laser. It should be noted that, in the present embodiment, the prepreg 3 which is a resin film having a reinforcement base material, such as glass fiber, is used as an insulating layer 3 connecting the inner layer material 2 and the copper foil 4 for upper layer wiring. However, as substitute for the prepreg 3, it is possible to use a resin film, such as a polymer epoxy resin and a thermoplastic polyimide adhesive film, which are generally used in a multilayer wiring substrate and which are not provided with a reinforcement base material. Further, in the present embodiment, a copper foil 4 is used as the metal foil 4 for upper layer wiring. However, as substitute for the copper foil 4, it is possible to use foils, such as a nickel foil, an aluminum foil, and a composite foil of these, each of which foils is used as a material of a multilayer wiring substrate. Further, the insulating layer 3 and the metal foil 4 may also be formed by using a one-face-copper-foil-attached resin film in which a resin film having a reinforcement base material or a resin film having no reinforcement base material is provided on the copper foil.

As a method in which the prepreg and the copper foil on the upper layer thereof are laminated integrally on the inner layer material on which the wiring is formed, there is used a method in which the inner layer material, the prepreg, and the copper foil are laminated and pressed, or a method in which the one-face-copper-foil-attached resin film is laminated on the inner layer material. The thickness of the insulating layer is preferably set to 10 to 100 µm and more preferably to 20 to 60 µM. The thickness of the copper foil is set to 3 to 12 µm.

In the present embodiment, since a prepreg is used as the insulating layer, one-face-copper-foil-attached resin film in this case is configured such that the prepreg (a resin film having a reinforcement base material) is provided on the copper foil. When a resin film having no reinforcement base material is used other than the prepreg, a resin film, such as a polymer epoxy resin and a thermoplastic polyimide adhesive film, in each of which a reinforcement base material is not provided on a copper foil, may also be provided as the insulating layer.

As the copper foil and the resin composition (resin varnish) which are used for manufacturing the one-face-copper-foil-attached resin film, a copper foil and a resin composition, which are the same as those used in a general multilayer wiring substrate, are used. For example, a resin composition (resin varnish) is coated onto a copper foil by using a kiss coater, a roll coater, a comma coater, or the like, or a resin film made of a resin composition formed into a B stage (semi-hardened state) film is laminated on a copper foil. When the resin composition (resin varnish) is coated on the copper foil, the resin varnish is heated and dried to be formed into a B stage (semi-hardened state). As the heating conditions, it is appropriate that the temperature is 100 to 200° C., and that the time is 1 to 30 minutes. Further, it is appropriate that the residual solvent content in the heated and dried resin composition (resin varnish) is in a range of about 0.2 to 10 mass %. When the film-state resin is laminated on the metal foil, conditions of 50 to 150° C. and 0.1 to 5 MPa are suitable in a vacuum or atmospheric pressure condition.

The blackening treatment layer formed on the copper foil for upper layer wiring layer can be formed by a known method for making a copper foil adhere to an insulating layer in a general multilayer wiring substrate. Examples of blackening treatment layers formed in this way include a layer having depressions and projections formed on the surface of a copper foil by copper oxide processing or etching.

Further, examples of lasers, which can be used for forming the hole for via holes, include gas laser, such as $CO_2$, CO, and excimer laser, and solid-state laser, such as YAG By $CO_2$ laser, high power can be easily obtained. Further, by a direct laser method which has been developed in recent years, even a hole for via holes having a diameter of 50 µm or less can be formed.

Next, as shown in step (1-2) of FIG. 1, by using an etching solution, such as a ferric chloride aqueous solution, sodium persulfate, a sulfuric acid-hydrogen peroxide mixed aqueous solution, and the like, half-etching is performed until the thickness of the copper foil 4 for upper layer wiring becomes about 1 to 5 pa. By this processing, the blackening treatment layer formed on the copper foil 4 is removed.

Figure 2:
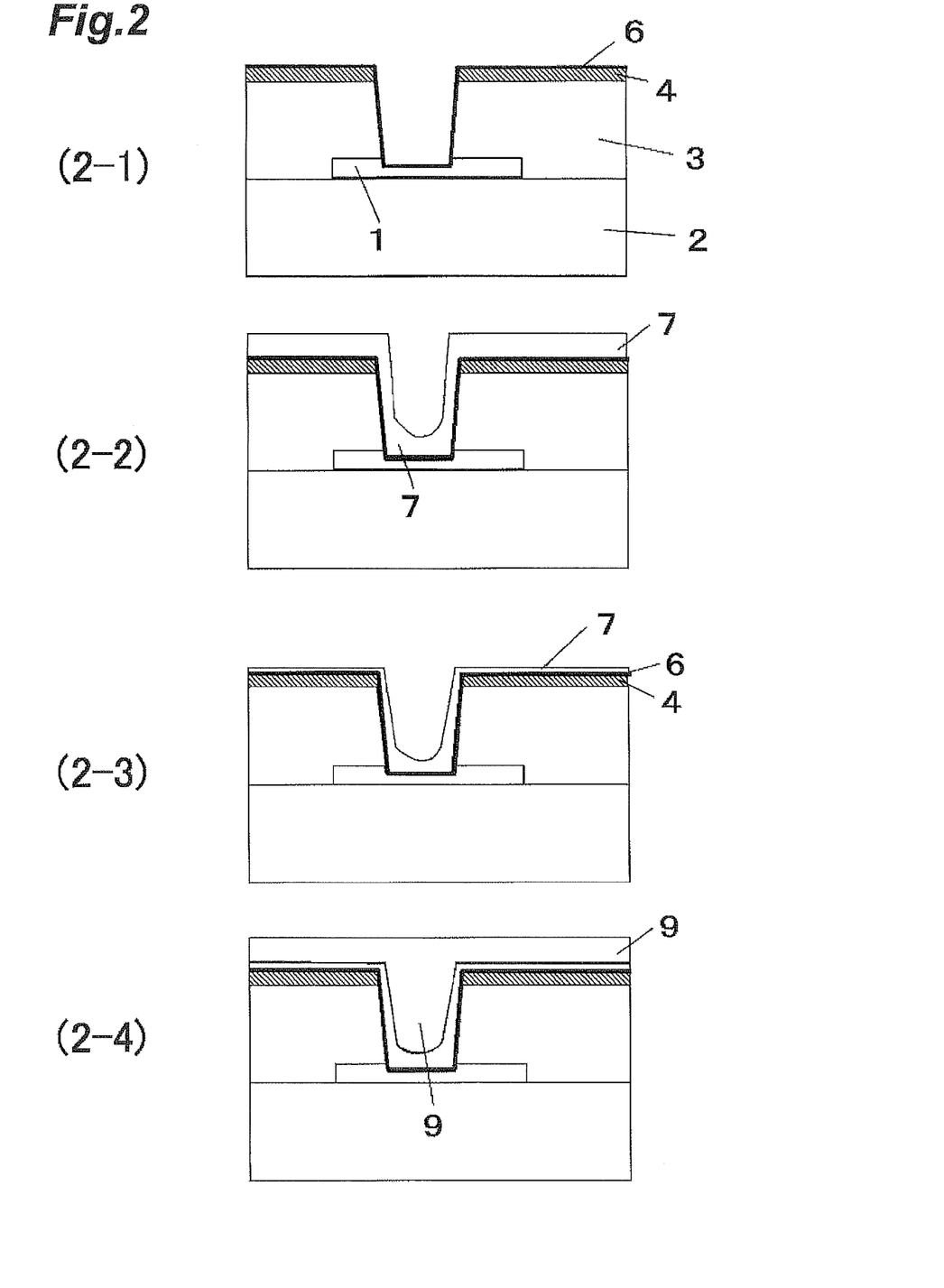
FIG. 2 shows step (2) of the method for manufacturing the multilayer wiring substrate according to the embodiment of the present invention.

Next, after removing the resin residue remaining on the bottom of the hole 5 for via holes by a desmear treatment, as shown in step (2-1) of FIG. 2, catalyst nucleus are attached on the copper foil and the inner portion of the via hole, and then an electroless copper plating layer 6 is formed. For example, activator neo Gantt (produced by Atotech Japan Co., Ltd., trade name: Neoganto is a registered trademark) that is a palladium ion catalyst, or a palladium colloid catalyst HS201B (produced by Hitachi Chemical Co., Ltd., trade name) is used for attaching a catalyst nucleus. In the present embodiment, the amount of the palladium catalyst adsorbed into the copper foil is in the range of 0.03 to 0.6 µg/cm$^2$, and more preferably in the range of 0.05 to 0.3 µg/cm$^2$. As the treatment temperature when the palladium catalyst is adsorbed, the temperature in the range of 10 to 40° C. is preferred. The amount of the palladium catalyst adsorbed on the copper foil can be controlled by controlling the treatment time.

Further, a commercially available electroless copper plating solution, such as CUST2000 (produced by Hitachi Chemical Co., Ltd., trade name "CUST" is a registered trademark), and CUST201 (produced by Hitachi Chemical Co., Ltd., trade name), can be used for forming the electroless copper plating layer. As these electroless copper plating solutions, copper sulfate, formalin, a complexing agent, sodium hydroxide are used as main components. The thickness of the electroless copper plating layer may be a thickness enough to supply electric power used for forming next electrolysis filled copper plating layer. The thickness of the electroless copper plating layer is in the range of 0.1 to 5 µm, and more preferably in the range of 0.5 to 1.0 µm.

Next, as shown in step (2-2) of FIG. 2, after the electroless copper plating layer 6 is formed, a first electrolytic filled copper plating layer 7 is formed to an extent that the hole 5 for via holes is not completely filled. As the thickness of the electrolytic filled copper plating layer 7, in order so that the thickness of the electrolytic filled copper plating layer 7 on the bottom surface in the hole 5 for via holes is larger than the thickness of the electrolytic filled copper plating layer 7 on the copper foil 4 for upper layer wiring, the thickness of the electrolytic filled copper plating layer 7 on the copper foil 4 for upper layer wiring is set in the range of 0.5 to 5.0 µm, and the thickness of the electrolytic filled copper plating layer 7 on the bottom surface in the hole 5 for via holes is set in the range of 2 to 20 µm.

Next, as shown in step (2-3) of FIG. 2, etching, using an etching solution, such as a ferric chloride aqueous solution, ammonium persulfate, and a sulfuric acid-hydrogen peroxide mixed aqueous solution, is performed to remove material at least until the thickness of the electrolytic filled copper plating layer 7 on the copper foil 4 for upper layer wiring becomes half or less than the thickness before the etching, or at most until the thickness of the base electroless plating layer 6 on the copper foil 4 for upper layer wiring becomes about half of the thickness before the etching. By this etching, organic matters adhering in the via, especially, the additives and foreign matters, which are attached to the first electrolytic filled copper plating layer 7 when it is formed, can be removed. For this reason, the effects of the additives and foreign matters adhering to the surface of the electrolytic filled copper plating layer 7 can be removed.

Next, as shown in step (2-4) of FIG. 2, on the first electrolytic filled copper plating layer 7, the surface of which is etched, or on the electroless copper plating layer 6, a second electrolytic filled copper plating layer 9 is formed to completely fill the hole 5 for via holes. By the second electrolytic filled copper plating layer 9, the inner portion of the hole 5 for via holes is completely filled. The portion on the hole 5 for via hole, which portion serves as an upper layer wiring 10, and the portions other than the hole 5 for via holes, are flattened. In order to form the second electrolytic filled plating layer 9, copper sulfate electroplating for filled via, which is used for a normal multilayer wiring substrate, can be used, and in this case, the electrolytic plating solution used for forming the first electrolytic plating layer 7 may be used, or a different plating solution may also be used. As for the thickness of plating, it is only necessary that the plating layer can be used as a wiring and that the via hole is filled with the conductor metal. The thickness of plating is preferably in the range of 1 to 100 van and more preferably in the range of 10 to 50 μm. Generally, in the electrolytic filled copper plating, the thickness of copper deposited on the bottom portion of the hole for via hole is larger than the thickness of copper deposited on the surface of the hole for via hole, and hence the aspect ratio is already reduced when the inner portion of the hole for via holes is filled with the second electrolytic filled plating layer 9. Further, in the etching, since the etching solution is difficult to enter into the hole for via hole, the inner portion of the hole for via hole is more difficult to be etched than the surface layer, and hence the amount of etching in the inner portion of the hole for via hole becomes smaller than the amount of etching on the surface layer. For this reason, in a hole for via hole having a small diameter and a large insulating layer, since the diameter of the hole for via hole does not become relatively small, and since the depth to the bottom of the hole for via hole becomes relatively small, the occurrence of voids can be suppressed.

It should be noted that, in the present embodiment, the formation of the electrolytic filled plating layer is separately performed twice to completely fill the hole for via hole, but the formation of the electrolytic filled plating layer is not limited to twice and may also be separately performed twice or more. In the case where the formation of the electrolytic filled plating layer for filling the hole for via hole is separately performed twice or more, the occurrence of voids can be similarly suppressed in a manner of etching an electrolytic filled plating layer, which is formed in the hole for via hole and on the metal foil for upper layer wiring just before second or subsequent electrolytic filled plating layer are each formed.

Figure 3:
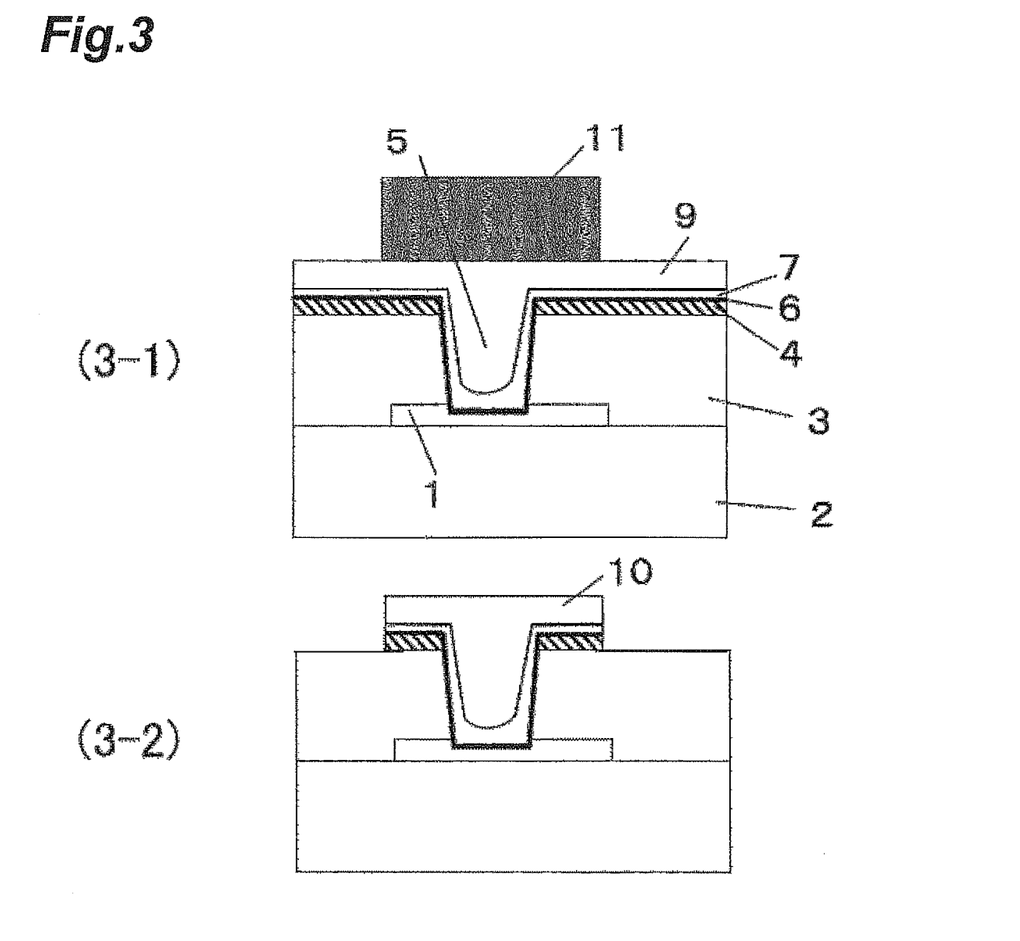
FIG. 3 shows step (3) of the method for manufacturing the multilayer wiring substrate according to the embodiment of the present invention.

Next, as shown in step (3-1) of FIG. 3, an etching resist 11 having the thickness of 29 μm is formed by using SL-1229 (produced by Hitachi Chemical Co., Ltd., trade name) which is a dry film resist. The etching resist 11 is removed by development from portions other than the portion on the hole for via hole 5 and the portion serving as the upper layer wiring 10.

Next, as shown in step (3-2) of FIG. 3, after the portions other than the upper layer wiring 10 are removed by etching, the etching resist 11 is peeled by using an alkaline stripping solution, sulfuric acid, or a commercially available resist stripping solution, so that the upper layer wiring 10 is formed. With the above-described method, a multilayer wiring substrate having a two-layer wiring made of the inner layer wiring 1 and the upper layer wiring 10 is completed. Further, when a multilayer wiring substrate having more number of wirings is produced, the substrate is formed in such a manner that roughening, or the like, of the surface of the upper layer wiring 10 of the multilayer wiring substrate is performed to increase the adhesiveness between the upper layer wiring 10 and the insulating layer (not shown) to be formed on the upper layer wiring 10, and then a prepreg and a copper foil for upper layer wiring formed thereon are provided by lamination, or the like.

EXAMPLES

In the following, the present invention will be explained on the basis of examples, but the present invention is not limited to the examples.

Example 1

First, as shown in step (1-1) of FIG. 1, an one-face-copper-foil-attached resin film, which is made of a resin film serving as an insulating layer 3 and having the thickness of 30 μm and a copper foil 4 serving as a copper foil 4 for upper layer wiring and having the thickness of 5 μm, is vacuum-laminated, at conditions of 120° C. and 2 MPa, on an inner layer material 2 on which an inner layer wiring 1 is formed. Next, on the surface of the copper foil 4 for upper layer wiring, a blackening treatment layer 8 having a thickness of 0.3 to 0.5 μm is formed, and then a hole 5 for via hole having the diameter of 30 μm is formed by a direct laser method using a $CO_2$ laser.

Next, as shown in step (1-2) of FIG. 1, by an etching solution, such as a ferric chloride aqueous solution, ammonium persulfate, and a sulfuric acid-hydrogen peroxide mixed aqueous solution, half-etching is performed until the thickness of the copper foil for upper layer wiring becomes 2 to 3 μm, in order to remove the blackening treatment layer of the copper foil for upper layer wiring.

Next, the resin attached to the via hole bottom is removed by performing a desmear treatment. Then, as shown in step (2-1) of FIG. 2, catalyst nucleus are attached on the copper foil and in the inner portion of the hole for via hole by using HS201B (produced by Hitachi Chemical Co., Ltd., trade name) which is a palladium colloid catalyst, and then a base electroless plating layer having the thick of 0.5 μm is formed by using CUST2000 (produced by Hitachi Chemical Co., Ltd., trade name, "CUST" is a registered trademark).

Next, as shown in step (2-2) of FIG. 2, the first electrolytic filled copper plating layer, in which the thickness on the copper foil for upper layer wiring is 5 μm and in which the thickness of the bottom surface in the hole for via hole is 15 μm, is formed. As the electrolytic plating solution, a commercially available direct current electrolytic plating solution CU-BRITE VFIV (produced by JCU Co., Ltd., trade name) is used.

Next, as shown in stage (2-3) of FIG. 2, by etching using an etching solution of ammonium persulfate, and a sulfuric acid-hydrogen peroxide mixed aqueous solution, the electrolytic filled copper plating layer is removed until the film thickness of the electrolytic filled copper plating layer on the copper foil for upper layer wiring becomes 2 μm.

Next, as shown in stage (2-4) of FIG. 2, the thickness of the second electrolytic filled copper plating layer on the copper foil for upper layer wiring is set to 20 μm to fill the hole for via hole. As the electrolytic plating solution used for forming the second electrolytic filled copper plating layer, a solution, which is the same as the electrolytic plating solution used for forming the first electrolytic filled copper plating layer, is used.

Next, as shown in step (3-1) of FIG. 3, an etching resist having the thickness of 29 μm is formed by using SL-1229 (produced by Hitachi Chemical Co., Ltd., trade name) which is a dry film resist. The etching resist is removed from portions other than the portion on the hole for via hole and the portion to be formed as the upper layer wiring. Next, as shown step (3-2) of FIG. 3, the copper other than the copper as the upper layer wiring is removed by etching, and then the etching resist is removed by using an alkaline stripping solution, sulfuric acid, or a commercially available resist stripping solution, so that the upper layer wiring is formed.

Example 2

First, as shown in step (1-1) of FIG. 1, an one-face-copper-foil-attached resin film, which has a resin film serving as an insulating layer and having a thickness of 30 μm, and which has a copper foil serving as a copper foil for upper layer wiring and having the thickness of 5 μm, is vacuum-laminated, at conditions of 120° C. and 2 MPa, on an inner layer material on which an inner layer wiring is formed. Next, on the surface of the copper foil for upper layer wiring, a blackening treatment layer 8 having a thickness of 0.3 to 0.5 μm is formed, and then a hole for via hole having a diameter of 30 μm is formed by a direct laser method using a $CO_2$ laser.

Next, as shown in step (1-2) of FIG. 1, by an etching solution, such as a ferric chloride aqueous solution, ammonium persulfate, and a sulfuric acid-hydrogen peroxide mixed aqueous solution, half-etching is performed until the thickness of the copper foil for upper layer wiring becomes 2 to 3 μm, in order to remove the blackening treatment layer of the copper foil for upper layer wiring.

Next, the resin attached to the via hole bottom is removed by performing a desmear treatment. Then, as shown in step (2-1) of FIG. 2, catalyst nucleus are attached on the copper foil and in the inner portion of the hole for via hole by using HS201B (produced by Hitachi Chemical Co., Ltd., trade name) which is a palladium colloid catalyst, and then a base electroless plating layer having the thick of 0.5 μm is formed by using CUST2000 (produced by Hitachi Chemical Co., Ltd., trade name, "OUST" is a registered trademark).

Next, as shown in step (2-2) of FIG. 2, the first electrolytic filled copper plating layer, in which the thickness on the copper foil for upper layer wiring is 2 μm and in which the thickness of the bottom surface in the hole for via hole is 3 μm, is formed. As the electrolytic plating solution, a commercially available direct current electrolytic plating solution CU-BRITE VFIV (produced by ICU Co., Ltd., trade name) is used.

Next, as shown in stage (2-3) of FIG. 2, by using a mixed etching solution of sodium persulfate and sulfuric acid, the electrolytic filled copper plating layer is removed by etching until the film thickness of the electrolytic filled copper plating layer on the copper foil for upper layer wiring becomes 1.5 μm.

Next, as shown in stage (2-4) of FIG. 2, the thickness of the second electrolytic filled copper plating layer on the copper foil for upper layer wiring is set to 20 μm to fill the hole for via hole. As the electrolytic plating solution used for forming the second electrolytic filled copper plating layer, a solution, which is the same as the electrolytic plating solution used for forming the first electrolytic filled copper plating layer, is used.

Next, as shown in step (3-1) of FIG. 3, an etching resist having the thickness of 29 μm is formed by using SL-1229 (produced by Hitachi Chemical Co., Ltd., trade name) which is a dry film resist. The etching resist is removed from portions other than the portion on the hole for via hole and the portion to be formed as the upper layer wiring. Next, as shown step (3-2) of FIG. 3, the copper other than the copper as the upper layer wiring is removed by etching, and then the etching resist is removed by using an alkaline stripping solution, sulfuric acid, or a commercially available resist stripping solution, so that the upper layer wiring is formed.

Comparison Example

First, as shown in step (1-1) of FIG. 1, an one-face-copper-foil-attached resin film, which has a resin film serving as an insulating layer and having a thickness of 30 μm, and which has a copper foil serving as a copper foil for upper layer wiring and having the thickness of 5 is vacuum-laminated, at conditions of 120° C. and 2 MPa, on an inner layer material on which an inner layer wiring is formed. Next, on the surface of the copper foil for upper layer wiring, a blackening treatment layer 8 having a thickness of 0.3 to 0.5 μm is formed, and then a hole for via hole having a diameter of 30 μm is formed by a direct laser method using a $CO_2$ laser.

Next, as shown in step (1-2) of FIG. 1, by an etching solution, such as a ferric chloride aqueous solution, ammonium persulfate, and a sulfuric acid-hydrogen peroxide mixed aqueous solution, half-etching is performed until the thickness of the copper foil for upper layer wiring becomes 2 to 3 μm, in order to remove the blackening treatment layer of the copper foil for upper layer wiring.

Next, the resin attached to the via hole bottom is removed by performing a desmear process. Then, as shown in step (2-1) of FIG. 2, catalyst nucleus are attached on the copper foil and in the inner portion of the hole for via hole by using HS201B (produced by Hitachi Chemical Co., Ltd., trade name) which is a palladium colloid catalyst, and then a base electroless plating layer having a thick of 0.5 μm is formed by using CUST2000 (produced by Hitachi Chemical Co., Ltd., trade name: "CUST" is a registered trademark).

Next, an electrolytic filled copper plating layer having the thickness of 20 μm is formed on the copper foil for upper layer wiring. That is, the hole for via hole is filled by formation of the first electrolytic filled copper plating layer so that the surface of upper layer wiring on the hole for via hole and the surface of upper layer wiring except on the hole for via hole are flattened. As the electrolysis filled copper plating solution, a commercially available direct current electrolytic plating solution CU-BRITE VFIV (produced by JCU Co., Ltd., trade name) is used.

Next, as shown in step (3-1) of FIG. 3, an etching resist having the thickness of 29 μm is formed by using SL-1229 (produced by Hitachi Chemical Co., Ltd., trade name) which is a dry film resist. The etching resist is removed from portions other than the portion on the hole for via hole and the portion to be formed as the upper layer wiring. Next, as shown step (3-2) of FIG. 3, the copper other than the copper as the upper layer wiring is removed by etching, and then the etching resist is removed by using an alkaline stripping solution, sulfuric acid, or a commercially available resist stripping solution, so that the upper layer wiring is formed.

Table 1 shows the frequency of occurrence of plating voids in examples 1 and 2 and comparison example. In examples 1 and 2, the frequency of occurrence of voids was 0%, and the hole for via hole could be filled. On the other hand, in comparison example, the frequency of occurrence of voids was about 100%.

TABLE 1

| Items | Example 1 | Example 2 | Comparison example |
|---|---|---|---|
| First electrolysis filled plating | 5 μm | 2 μm | 20 μm |
| Etching amount | 3 μm | 0.5 μm | No |
| Second electrolysis filled plating | 20 μm | 20 μm | No |
| Void occurrence rate | 0.00% | 0.00% | 100% |

INDUSTRIAL APPLICABILITY

The present invention can provide a method for manufacturing a multilayer wiring substrate, in which occurrence of plating voids of an electrolytic filler plating layer can be suppressed even in a hole for via hole that has the diameter almost equal to the thickness of an insulating layer, and hence, is effective in industry.

Reference Signs List

1. Inner layer wiring
2. Inner layer material
3. Prepreg or insulating layer
4. Metal foil or copper foil
5. Hole for via hole
6. Electroless plating layer or electroless copper plating layer
7. First electrolytic filled plating layer or first electrolytic filled copper plating layer
8. Blackening treatment layer
9. Second electrolytic filled plating layer or second electrolytic filled copper plating layer
10. Upper layer wiring
11. Etching resist

The invention claimed is:

1. A method for manufacturing a multilayer wiring substrate including:
   step (1) of integrally laminating an inner layer material having an inner layer wiring formed thereon, an insulating layer, and a metal foil for upper layer wiring, and providing, in the metal foil for upper layer wiring and the insulating layer, a hole for via hole extending from the metal foil for upper layer wiring to reach the inner layer wiring;
   step (2) of forming a base electroless plating layer in the hole for via hole and on the metal foil for upper layer wiring, and then filling the hole for via hole by forming an electrolytic filled plating layers to form a via hole connecting the metal foil for upper layer wiring and the inner layer wiring; and
   step (3) of forming an upper layer wiring by forming, after forming the electrolytic filled plating layer, the metal foil for upper layer wiring into a wiring,
   wherein, in step (2), filling of the hole for via hole is completed by separately forming each of the electrolytic filled plating layers and by etching a previous electrolytic filled plating layer formed in the hole for via hole and on the metal foil for upper layer wiring before a subsequent formation of a respective electrolytic filled plating layer.

2. The method for manufacturing a multilayer wiring substrate according to claim 1,
   wherein, in a step of etching the surface of the electrolytic filled plating layer formed before subsequent formation of respective electrolytic filled plating layers, the previous electrolytic filled plating layer previously formed on the metal foil for upper layer wiring is etched until the thickness of the previous electrolytic filled plating layer becomes at least half or less than the thickness thereof.

3. The method for manufacturing a multilayer wiring substrate according to claim 1, wherein each of the filled electrolytic plating layers is formed by using the same type of electrolytic plating solution.

4. The method for manufacturing a multilayer wiring substrate according to claim 1, wherein each of the filled electrolytic plating layers is an electrolytic copper plating layer.

5. The method for manufacturing a multilayer wiring substrate according to claim 1, wherein each of the filled electrolytic plating layers comprises copper.

6. The method for manufacturing a multilayer wiring substrate according to claim 1, wherein, in step (2), etching a previous electrolytic filled plating layer formed in the hole for via hole and on the metal foil for upper layer wiring before a subsequent formation of a respective electrolytic filled plating layer leaves a reduced thickness electrolytic filled plating layer formed in the hole for via hole and on the metal foil.

7. The method for manufacturing the multilayer wiring substrate according to claim 1, wherein
   step (2) includes:
   step (2-1) of forming the base electroless plating layer in the hole for via hole and on the metal foil for upper layer wiring;
   step (2-2) of forming a first electrolytic filled plating layer incompletely filling the hole for via hole;
   step (2-3) of etching the surface of the first electrolytic filled plating layer formed in step (2-2); and
   step (2-4) of forming the second electrolytic filled plating layer completely filling the hole for via hole, on the first electrolytic filled plating layer, the surface thereof being etched in step (2-3).

8. The method for manufacturing a multilayer wiring substrate according to claim 7,
   wherein, in the step (2-3) of etching, the previous electrolytic filled plating layer previously formed on the metal foil for upper layer wiring is etched until the thickness of the previous electrolytic filled plating layer becomes at least half or less than the thickness thereof.

9. A method for manufacturing a multilayer wiring substrate, comprising:
   providing a laminate comprising an inner layer material having an inner layer wiring formed thereon, an insulating layer provided over the inner layer material and the inner layer wiring, and a metal foil provided over the insulating layer;
   forming a hole for via hole extending from the metal foil to the inner layer wiring through the insulating layer;
   forming a base electroless plating layer in the hole and on the metal foil;
   forming a first electrolytic plating layer on the base electroless plating layer in the hole and above the metal foil without filling the hole;
   etching the first electrolytic plating layer in the hole and above the metal foil leaving a reduced thickness first electrolytic plating layer in the hole and above the metal foil;
   forming a second electrolytic plating layer on the reduced thickness first electrolytic plating layer in the hole and above the metal foil;
   forming an upper layer wiring from the metal foil.

10. The method for manufacturing a multilayer wiring substrate according to claim 9, wherein the forming of the second electrolytic plating layer completes a via hole that connects the metal foil and the inner layer wiring by filling the hole.

11. The method for manufacturing a multilayer wiring substrate according to claim 9, further comprising:
- etching the second electrolytic plating layer in the hole and above the metal foil leaving a reduced thickness second electrolytic plating layer in the hole and above the metal foil; and
- forming a third electrolytic plating layer on the reduced thickness second electrolytic plating layer in the hole and above the metal foil so as to complete a via hole that connects the metal foil and the inner layer wiring by filling the hole.

12. The method for manufacturing a multilayer wiring substrate according to claim 9, wherein the forming of the laminate includes laminating a foil-attached resin film in which the metal foil is attached to the insulating layer to the inner layer material.

13. The method for manufacturing a multilayer wiring substrate according to claim 9, wherein the forming of the hole includes forming the hole by a direct laser method.

14. The method for manufacturing a multilayer wiring substrate according to claim 9, wherein the forming of the first electrolytic plating layer includes forming the first electrolytic plating layer so that the thickness of an inner portion of the first electrolytic plating layer on a bottom surface in the hole is thicker than the thickness of an surface portion of the first electrolytic plating layer above the metal foil.

15. The method for manufacturing a multilayer wiring substrate according to claim 9, wherein the etching of the first electrolytic plating layer includes etching the first electrolytic plating layer until the thickness of a surface portion of the first electrolytic plating layer above the metal foil becomes half or less than the thickness thereof before the etching.

16. The method for manufacturing a multilayer wiring substrate according to claim 9, wherein the first electrolytic plating layer and the second electrolytic plating layer are formed by using the same type of electrolytic plating solution.

17. The method for manufacturing a multilayer wiring substrate according to claim 9, wherein the first electrolytic plating layer is an electrolytic copper plating layer and the second electrolytic plating layer is an electrolytic copper plating layer.

18. The method for manufacturing a multilayer wiring substrate according to claim 9, wherein each of the first electrolytic plating layer and the second electrolytic plating layer comprises copper.

* * * * *